(12) United States Patent
Ozawa (10) Patent No.: US 8,867,628 B2
(45) Date of Patent: Oct. 21, 2014

(54) TRANSMISSION APPARATUS AND TRANSMISSION METHOD

(75) Inventor: Takeshi Ozawa, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 1060 days.

(21) Appl. No.: 12/754,492

(22) Filed: Apr. 5, 2010

(65) Prior Publication Data

US 2010/0260272 A1 Oct. 14, 2010

(30) Foreign Application Priority Data

Apr. 8, 2009 (JP) ................................. 2009-094101

(51) Int. Cl.
*H04N 7/12* (2006.01)
*H04B 1/66* (2006.01)
*H04N 7/66* (2006.01)
*H03M 13/37* (2006.01)
*H03M 13/29* (2006.01)

(52) U.S. Cl.
CPC ............... *H04N 7/66* (2013.01); *H03M 13/373* (2013.01); *H03M 13/2909* (2013.01)
USPC .................................................. 375/240.27

(58) Field of Classification Search
CPC ....... H04N 7/66; H04N 7/64; H04N 7/26244; H03M 13/373; H03M 13/2909

USPC ........................... 348/47; 375/240.26, 240.27
IPC ...................................... H04N 7/12; H04B 1/66
See application file for complete search history.

(56) References Cited

U.S. PATENT DOCUMENTS

| 7,516,387 B2* | 4/2009 | Arnold et al. ................. 714/751 |
| 7,577,898 B2* | 8/2009 | Costa et al. ................... 714/776 |
| 8,127,206 B2* | 2/2012 | Singh et al. ................... 714/769 |
| 2012/0011413 A1* | 1/2012 | Liu et al. ...................... 714/746 |

FOREIGN PATENT DOCUMENTS

JP 2004-215224 A 7/2004

* cited by examiner

*Primary Examiner* — Tung Vo
(74) *Attorney, Agent, or Firm* — Canon USA, Inc. IP Division (57) ABSTRACT

An apparatus which generates a first correction packet to correct an error in a first moving image packet based a first combination which includes a first moving image packet and a second moving image packet and generates a second correction packet to correct the error in the first moving image packet based on a second combination which includes the first moving image packet and a third moving image packet. The apparatus further transmits the first, the second, and the third moving image packets and the first correction packet to a first and a second receiving apparatuses, respectively and transmits the second correction packet to the second receiving apparatus.

18 Claims, 7 Drawing Sheets

TRANSMISSION APPARATUS AND TRANSMISSION METHOD

BACKGROUND OF THE INVENTION

1. Field of the Invention

The present invention relates to a transmission apparatus and a transmission method thereof.

2. Description of the Related Art

Recently, transmission and reception of moving image data via a network have been dramatically increasing. According to a wider bandwidth of the Internet or a widely spread local area network (LAN), the transmission and reception of the moving image data becomes easier than before. However, the transmission and reception of the moving image data still places a heavy load on the network because of a high quality in the moving image and diversification of use of the moving image data.

As a transmission data amount of the moving image data per a unit of time becomes larger, the more number of packets are generated from the moving image data. Consequently, a packet loss due to a discretely-occurred communication error and a communication buffer overflow in a packet relay tends to occur.

As a conventional technique which prevents deterioration of image quality due to the packet loss, a forward error correction method (hereinafter referred to as the "FEC method") is known. In the FEC method, an FEC creation operation is performed with respect to a group which includes more than one moving image packets to generate FEC packets (i.e., error correction packets) and thereafter, transmits the generated FEC packets to a receiving side together with the moving image packets. A typical FEC creation operation is an exclusive OR operation (i.e., an XOR operation). When the XOR operation is used and one of the moving image packets in a group is lost, other moving image packets which are not lost in the group and the FEC packets are subjected to arithmetic processing, so that the moving image packet which has lost can be restored. The FEC packet can be generated in various manners, by the number of the moving image packets which are formed into a group and a group forming method.

Japanese Patent Application Laid-Open No. 2004-215224 discusses to change an error correction coding parameter based on quality information of a network route between a transmission destination node and a transmission source node.

However, when the moving image data is transmitted to a plurality of transmission destinations, if a setting for a data amount of error correction data differs to each other in every transmission destinations, a large load is produced by generation of the error correction data.

For example, it is assumed that a single FEC packet is transmitted to three moving image packets with respect to one receiving apparatus and a single FEC packet is transmitted to four moving image packets with respect to another receiving apparatus. In this case, if the FEC packet is generated for each of the receiving apparatus, a generation load to generate the FEC packet becomes larger.

SUMMARY OF THE INVENTION

According to an aspect of the invention, an apparatus includes a generation unit configured to generate a first correction packet to correct an error in a first moving image packet based on a first combination which includes the first moving image packet and a second moving image packet, and to generate a second correction packet to correct the error in the first moving image packet based on a second combination which includes the first moving image packet and a third moving image packet, and a determination unit configured to determine to transmit the first, the second, and the third moving image packets to a first and a second receiving apparatuses, to transmit the first correction packet between the first and the second error correction packets, to the first and the second receiving apparatuses, and to transmit the second correction packet between the first and the second correction packets, to the second receiving apparatus.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

An exemplary embodiment in which a method for generating and transmitting error correction data of the present invention is applied to a moving image transmission apparatus is described below with reference to drawings attached hereto. A first exemplary embodiment and a second exemplary embodiment exemplify such a case that the two-dimensional FEC method using the XOR operation is employed as a method for generating an FEC packet. The present invention is not limited to the first and the second exemplary embodiments which are mere examples.

Figure 1:
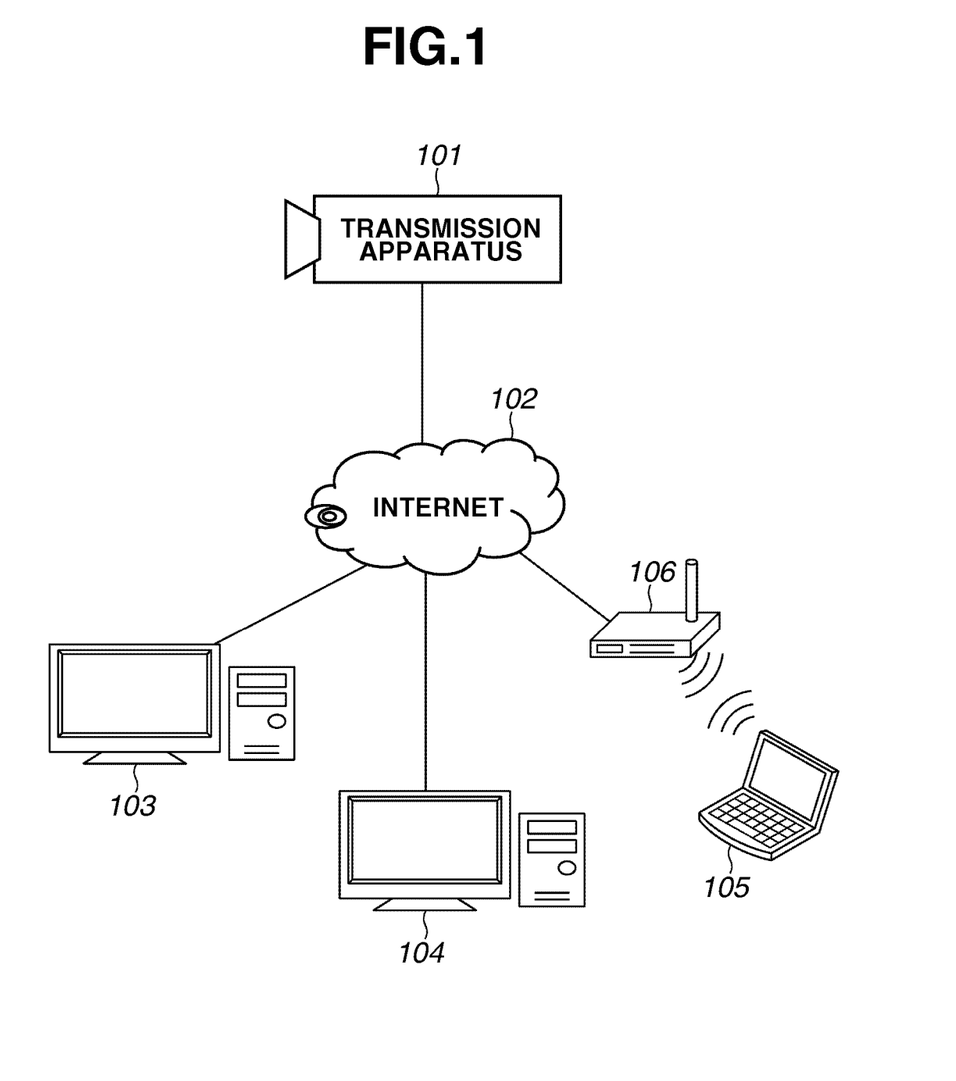
FIG. 1 is an entire configuration diagram illustrating a moving image distribution system.

FIG. 1 is a configuration diagram illustrating an entire system according to the present exemplary embodiment. As it is illustrated in FIG. 1, a transmission apparatus 101, receiving apparatuses 103, 104 and 105 and an access point 106 are connected to an Internet 102, respectively.

The transmission apparatus 101 has a streaming function and serves as a streaming server which transmits a moving image packet to the receiving apparatus. In other words, the transmission apparatus 101 transmits a moving image packet to the receiving apparatus.

The receiving apparatuses 103 and 104 are connected to the Internet 102 via a wired network. The receiving apparatus 105 is connected to the Internet 102 via a wireless LAN connection using the access point 106. Each on the receiving apparatuses 103 through 105 serves as a client which receives streaming data of moving images from the transmission apparatus 101. As for the Internet 102, a network is not limited to the Internet, and other network configurations may be used.

The transmission apparatus 101 recognizes the receiving apparatus 103 as a client 1, the receiving apparatus 104 as a client 2 and the receiving apparatus 105 as a client 3. An available network band from the transmission apparatus 101 to each of the receiving apparatuses fluctuates independently and a packet loss rate of each route also fluctuates independently. In the route between the transmission apparatus 101 and the receiving apparatus 105, the packet loss rate in a part of the wireless connection is larger in comparison with the packet loss rate in a part of the wired connection.

A two-dimensional FEC packet and an FEC generation parameter of the FEC packet generated by the transmission apparatus 101 of the present exemplary embodiment are described below with reference to FIG. 4. The FEC packet is an error correction packet to be used by the receiving apparatus correcting a moving image packet which was lost in the communication routes.

In other words, when the transmission apparatus 101 generates one FEC packet by using a plurality of moving image packets which is included in the same group, even if one of the moving image packets of the group was lost, the receiving apparatus can correct the error with the other moving image packets in the group and the FEC packet. It is also possible to form one group including only one moving image packet.

Figure 4:
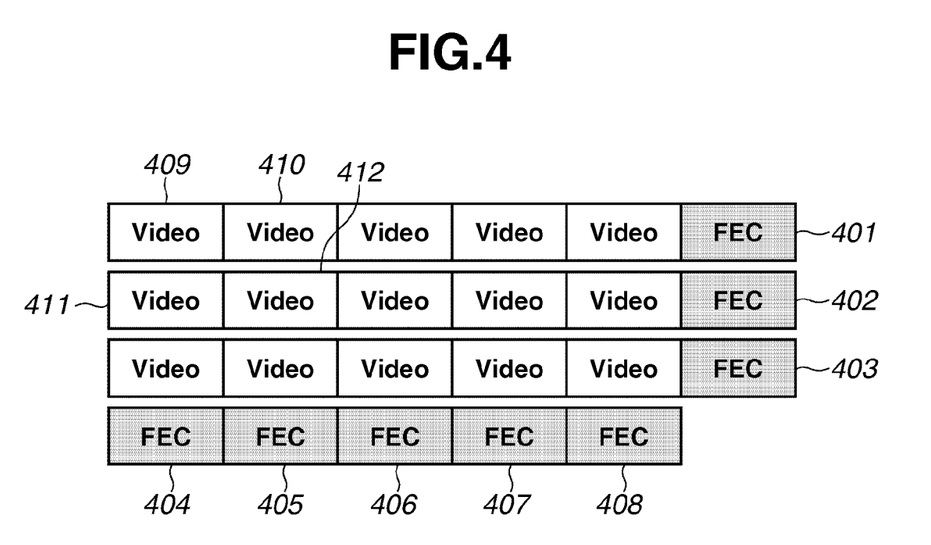
FIG. 4 illustrates two-dimensional FEC packets generated according to a first exemplary embodiment.

As it is illustrated in FIG. 4, the transmission apparatus 101 of the present exemplary embodiment generates the FEC packet, such that each of the moving image packets belongs to two groups. The transmission apparatus 101 of the present exemplary embodiment transmits a moving image packet 409 and a moving image packet 410 in this order from the left in FIG. 4. After transmitting the moving image packets in a first row, the transmission apparatus 101 transmits a moving packet 411 and a moving image packet 412 in a second row in this order from the left in FIG. 4.

More specifically, the transmission apparatus 101 generates the FEC packet based on a combination of the plurality of moving image packets which are sequential in a transmission order. Row direction FEC packets 401 through 403 are generated based on the combination of the plurality of moving image packets which are sequential in the transmission order.

The transmission apparatus 101 generates the FEC packet based on a combination of a plurality of moving image packets which are not sequential in the transmission order. Column direction FEC packets 404 through 408 are generated based on the combination of the plurality of moving image packets which are not sequential in the transmission order.

As described above, the transmission apparatus 101 of the present exemplary embodiment generates the FEC packet using the two different generation patterns. The transmission apparatus 101 determines a number of moving image packets to be used in generation of the FEC packet in each generation pattern (i.e., an FEC generation parameter) based on an FEC rate of each of a plurality of clients. More specifically, in an example as illustrated in FIG. 4, the transmission apparatus 101 determines the number of moving image packets aligned vertically and horizontally based on the FEC rate of each of the plurality of clients.

In the present exemplary embodiment, the generation pattern for generating the FEC packet using the plurality of moving image packets which are sequential in the transmission order and the generation pattern for generating the FEC packet using the plurality of moving image packets which are not sequential in the transmission order are described below. However, the generation patterns are not limited these two patterns. The present invention is applicable to any generation pattern which can generate FEC packet such that each of the moving image packets belong to a plurality of groups.

When the transmission apparatus 101 of the present exemplary embodiment delivers the moving image packets to the plurality of clients (i.e., the receiving apparatuses 103 through 105), the transmission apparatus 101 determines an appropriate FEC rate according to a communication situation between each of the clients and the transmission apparatus 101. The FEC rate indicates the number of FEC packets with respect to the number of moving image packets.

The transmission apparatus 101 according to the present exemplary embodiment determines the number of moving image packets which are sequential in the transmission order to generate each of the row direction FEC, based on the lowest FEC rate (i.e., an FEC rate in which the number of FEC packets with respect to the number of moving image packets is smallest) among the determined plurality of FEC rates.

Further, the transmission apparatus 101 according to the present exemplary embodiment determines the number of moving image packets which are not sequential in the transmission order to generate each of the column direction FEC, based on the highest FEC rate among the determined plurality of FEC rates. The highest FEC rate is the FEC rate in which the number of FEC packets with respect to the number of moving image packets of the plurality of FEC rates is the largest.

The transmission apparatus 101 transmits the FEC packet generated based on the combination of the moving image packets which are sequential in the transmission order (i.e., the row direction FEC packets 401 through 403) and the moving image packets to all the clients. The transmission apparatus 101 further transmits the FEC packet generated based on the combination of the moving image packets which are not sequential in the transmission order (i.e., the column direction FEC packets 404 through 408) to the clients according to the FEC rate of each of the clients. In other words, the moving image packets and the FEC packets generated from the moving image packets which are sequential in the transmission order are transmitted to the receiving apparatus which has the lowest FEC rate, and the FEC packets generated from the moving image packets which are not sequential in the transmission order are not transmitted to the receiving apparatus which has the lowest FEC rate.

As described above, the transmission apparatus 101 according to the present exemplary embodiment determines the number of moving image packets in each of the generation patterns of the FEC packets according to the FEC rate of each client. In this manner, the transmission apparatus 101 can transmit the FEC packets according to the FEC rate of each client without changing the generation pattern of the FEC packet for each client.

The transmission apparatus 101 transmits all the FEC packets generated by a singular generation pattern (i.e., the pattern which generates the FEC packet generated from the moving image packets which are sequential in the transmission order) with respect to the client which has the lowest FEC rate. More specifically, all the FEC packets generated by the singular generation pattern are at least transmitted to all the clients, so that all the moving image packets can have the minimum error correction function. Processing of the transmission apparatus 101 is described below in detail together with a description of a method for determining the FEC generation parameter.

Figure 2:
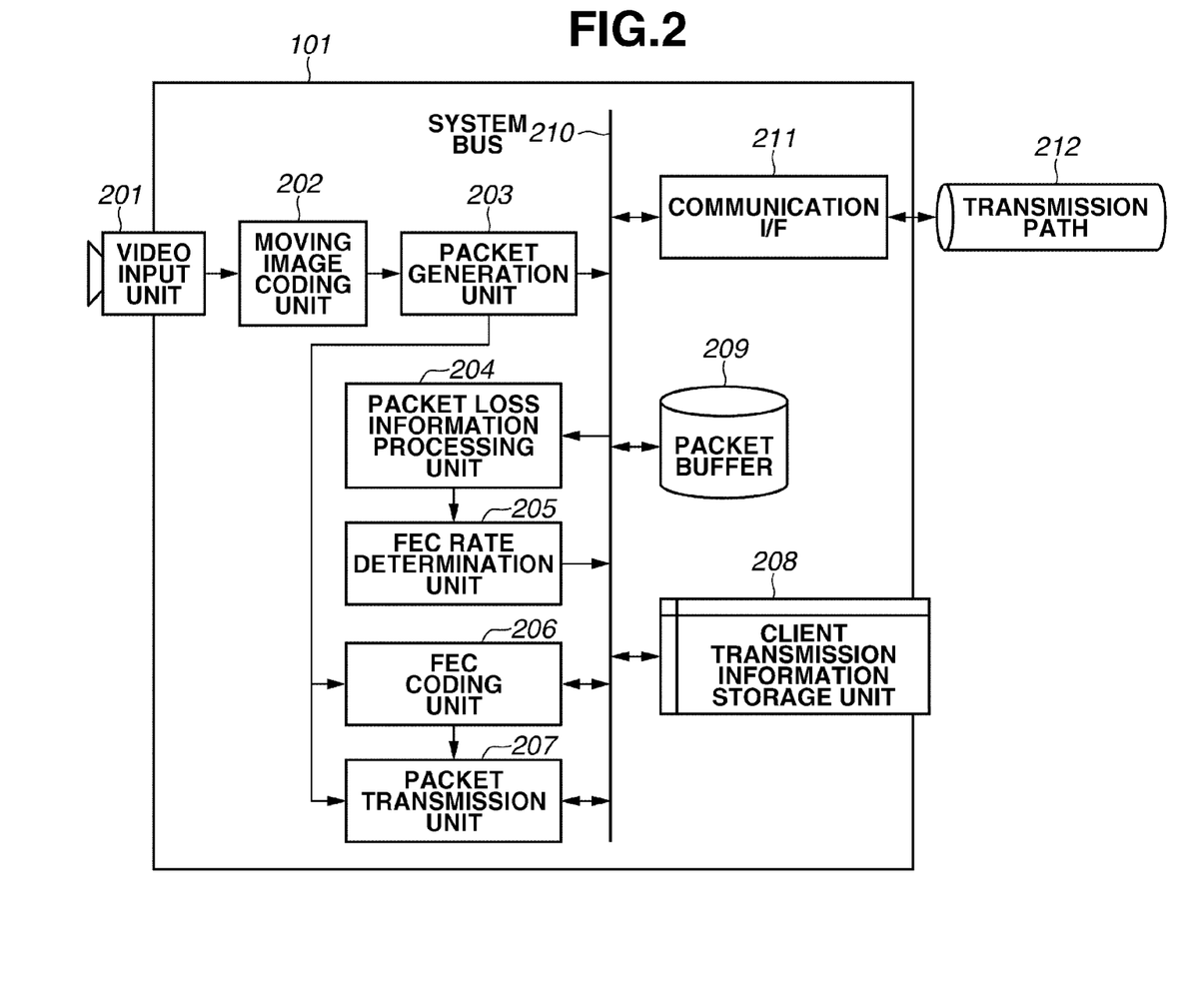
FIG. 2 is a block diagram illustrating a functional configuration of a transmission apparatus.

FIG. 2 is a block diagram illustrating an example of a configuration of the transmission apparatus 101 of the present exemplary embodiment. The transmission apparatus 101 includes a video input unit 201, a moving image coding unit 202, a packet generation unit 203 (hereinafter referred to as the "generation unit 203"), a packet loss information processing unit 204 (hereinafter referred to as the "processing unit 204"), an FEC rate determination unit 205 (hereinafter referred to as the "determination unit 205") and an FEC coding unit 206.

The transmission apparatus 101 further includes a packet transmission unit 207 (hereinafter referred to as the "transmission unit 207"), a client transmission information storage unit 208 (hereinafter referred to as the "storage unit 208"), a packet buffer 209 (hereinafter referred to as the "buffer 209"), a system bus 210 and a communication interface 211. The transmission apparatus 101 is connected to a transmission path 212 via the communication interface 211.

The video input unit 201 outputs acquired moving image data to the coding unit 202. The coding unit 202 compresses and encodes the moving image data output from the video input unit 201 by a compressing and coding method such as a Moving Picture Experts Group (MPEG)-4Video method or a H.264 method. The compressed and encoded moving image data is output to the generation unit 203.

The generation unit 203 converts the compressed and encoded moving image data into moving image packets that has a data size which can be communicated via the Internet 102 and stores the converted moving image packets in the buffer 209. The generation unit 203 further outputs a generation notification indicating generation of the moving image packets to the FEC coding unit 206 and the transmission unit 207. The generation notification includes identification information (for example, a sequence number) about the generated moving image packets.

On the other hand, the processing unit 204 receives received information transmitted by the receiving apparatus via the transmission path 212, the communication interface 211 and the system bus 210. The received information is, for example, the information indicating reception situation of the packet by the receiving apparatus. The information indicating the reception situation includes, for example, information about the number of received moving image packets and information about the number of the moving image packets which are lost in the communication routes. The processing unit 204 calculates the packet loss rate by analyzing the acquired received information and notifies the determination unit 205 of the packet loss rate from the transmission apparatus 101 to the receiving apparatus which transmits the received information.

The determination unit 205 determines an appropriate FEC rate for transmitting moving images to the receiving apparatus based on the notified packet loss rate, the packet loss rate which has been notified in the past, and an available network band width to the receiving apparatus.

The received information, that the processing unit 204 receives, includes information about an error situation of the moving image packets (i.e., error information). The determination unit 205 determines the number of FEC packets with respect to the number of moving image packets to be transmitted to the receiving apparatus based on the error information.

However, the information included in the received information is not limited to the information about the error situation. For example, request information about the FEC rate which is directly designated by a user of the receiving apparatus may be included in the received information.

The determination unit 205 notifies the storage unit 208 of the determined FEC rate. The determination method of the FEC rate is not limited to the above described method, and may be performed by using time information according to time required from transmission of the packet from the transmission apparatus to reception thereof by the receiving apparatus.

The storage unit 208 stores the FEC rate notified from the determination unit 205 together with the identification information (for example, an IP address) of each of the receiving apparatuses. An example of client information stored in the storage unit 208 is shown in Table 1.

TABLE 1

| Client Number | IP address | Sequence Number | Time Stamp | FEC rate |
|---|---|---|---|---|
| 1 | 192.168.1.1 | 2543 | 654321 | 20% |
| 2 | 192.254.3.1 | 641 | 567890 | 30% |
| 3 | 172.100.9.1 | 7348 | 345678 | 50% |

As it is shown in Table 1, the storage unit 208 of the transmission apparatus 101 stores, for example, a client number, an IP address, a sequence number, a time stamp and the FEC rate. In the present exemplary embodiment, a client of the client number 1 in Table 1 (i.e., the client 1) corresponds to the receiving apparatus 103. A client of the client number 2 in Table 1 (i.e., the client 2) corresponds to the receiving apparatus 104. Further, a client of the client number 3 in Table 1 (i.e., the client 3) corresponds to the receiving apparatus 105.

The client 1 (i.e., the receiving apparatus 103) is the client which has the lowest FEC rate among the plurality of clients which receives delivery of the moving image packet. The client 3 (i.e., the receiving apparatus 105) is the client which has the highest FEC rate among the plurality of clients which receives delivery of the moving image packet.

Each of the clients has the different sequence number and the time stamp. The transmission unit 207 transmits the FEC packet generated by the FEC coding unit 206 after rewriting the sequence number and the time stamp in the FEC packet for each client. This processing is described below in detail.

The FEC coding unit 206 reads the FEC rates of all the clients which are transmission destinations of the moving image packet from the storage unit 208 in response to reception of the generation notification of the moving image packet from the generation unit 203. The FEC coding unit 206 determines the FEC generation parameter based on the plurality of the read out FEC rates.

The FEC coding unit 206 of the present exemplary embodiment reads the FEC rates and determines the FEC generation parameter in response to the reception of the generation notification of the moving image packets corresponding to 20 group of pictures (GOP) received. However, the number of the GOPs is not limited to 20.

The reading of the FEC rate and the determination of the FEC generation parameter by the FEC coding unit 206 are not necessarily performed in response to the reception of the generation notification of the moving image packet. For another method, the reading of the FEC rate and the determination of the FEC generation parameter by the FEC coding unit 206 may be performed in response to, for example, reception of the received information from the receiving apparatus or may be performed at constant intervals. As yet another example, the reading of the FEC rate and the determination of the FEC generation parameter by the FEC coding unit 206 may be performed corresponding to increase or decrease of the receiving apparatuses which are designated as the transmission destination of the moving image packet. As still yet another example, the reading of the FEC rate and the determination of the FEC generation parameter by the FEC coding unit 206 may be performed at a timing to start transmission of the moving image packet and a timing at which a request for quality of the moving image packet is received from the user.

For example, when a large fluctuation of the FEC rate, which is appropriate to each of the receiving apparatuses, frequently occurs, the FEC generation parameter which is more appropriate to change in the communication situation can be determined by performing the determination of the FEC generation parameter at short intervals. Further, for example, when the fluctuation of the FEC rate, which is appropriate to each of the receiving apparatuses, is not so large, a load of the determination of the FEC generation parameter can be reduced by lengthening the intervals for determining the FEC generation parameter.

The FEC coding unit 206 generates the FEC packet using the determined FEC generation parameter and stores the FEC packet in the buffer 209. In other words, the FEC coding unit 206 generates the error correction packet for correcting the error of the moving image packet according to the combination of the plurality of moving image packets. The FEC coding unit 206 of the present exemplary embodiment generates the FEC packet by subjecting the plurality of moving image packets to the XOR operation. However, the method for generating the FEC packet is not limited to the method using the XOR operation.

When the FEC coding unit 206 stores the generated FEC packet in the buffer 209, the FEC coding unit 206 outputs the generation notification of the FEC packet including the identification information (for example, the sequence number) of the stored FEC packet to the transmission unit 207.

When the transmission unit 207 receives the generation notification of the moving image packet from the generation unit 203, the transmission unit 207 reads the moving image packet stored in the buffer 209 and further reads the transmission information about each client stored in the storage unit 208. Then, the transmission unit 207 changes a portion of a packet header (a time stamp and a sequence number of a real-time transport protocol (RTP) header) of the readout moving image packet to a value for each client. Then, the transmission unit 207 transmits the moving image packet to each client via the communication interface 211.

When the transmission unit 207 receives the generation notification of the FEC packet from the FEC coding unit 206, the transmission unit 207 reads the FEC packet stored in the buffer 209 and further reads the transmission information about each client stored in the storage unit 208. Subsequently, a portion of a packet header of the read FEC packet and partial data of a packet pay load are changed to values for each client. Then, the transmission unit 207 determines the FEC packet to be transmitted according to the FEC rate of each client and transmits the FEC packet to the client. The change and the selective transmission of the partial data of the FEC packet are described below in detail.

Determination processing of the FEC generation parameter is described below with reference to FIGS. 3 and 4 and Table 1. In the present exemplary embodiment, since the two-dimensional FEC method using the XOR operation is employed as the FEC method, the FEC generation parameter becomes a size of a matrix of the two-dimensional FEC packets.

Figure 3:
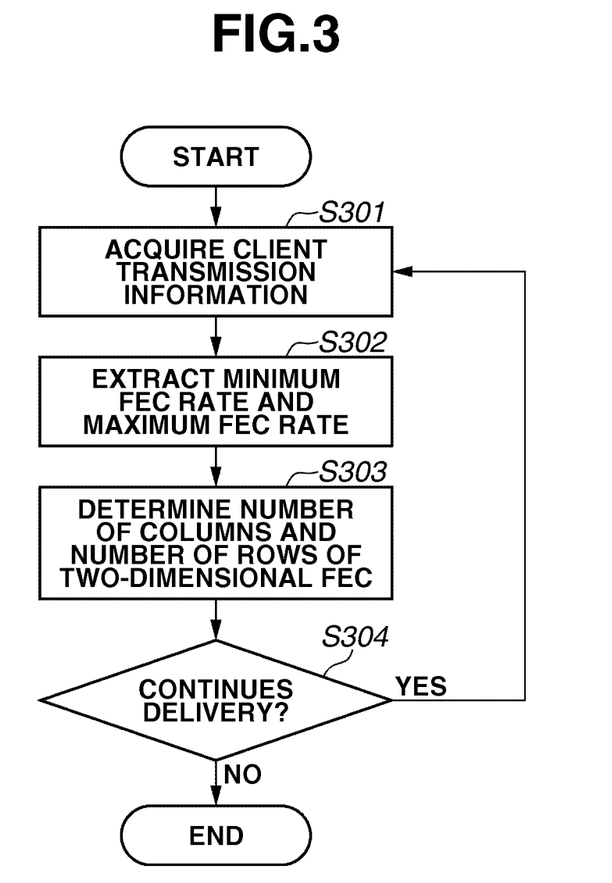
FIG. 3 is a flow chart illustrating processing of determining a generation pattern of an FEC packet.

FIG. 3 is a flow chart illustrating processing that the FEC coding unit 206 of the present exemplary embodiment determines the number of rows and the number of columns of the two-dimensional FEC packets (i.e., the FEC generation parameter) from the FEC rate of each client. The processing illustrated in this flow chart is started, for example, in response to reception, by the FEC coding unit 206, of the generation notification of the moving image packets from the generation unit 203. The processing may be executed by a computer (not illustrated) which is connected to the system bus 210 instead of being executed by the FEC coding unit 206. Then, the computer (not illustrated) may set the determined FEC generation parameter to the FEC coding unit 206.

In step S301, the FEC coding unit 206 acquires client transmission information from the storage unit 208. Examples of the client transmission information are as illustrated in Table 1. Three clients as illustrated in Table 1 are clients which currently receives delivery of the moving image packet from the transmission apparatus 101.

In step S302, the FEC coding unit 206 extracts the FEC rate from the acquired client transmission information and specifies the minimum FEC rate and the maximum FEC rate. In the examples of Table 1, the minimum FEC rate is 20% and the maximum FEC rate is 50%. "20% of the FEC rate" represents the rate that two FEC packets are generated with respect to ten moving image packets. Similarly, "50% of the FEC rate" represents the rate that, for example, five FEC packets are generated with respect to ten moving image packets. Further, the FEC rate is determined by the determination unit 205 based on the received information from each client.

In step S303 (i.e., generation processing), the FEC coding unit 206 determines the number of rows and the number of columns of the two-dimensional FEC packet (i.e., the FEC generation parameter) based on the minimum and maximum FEC rates which are specified in step S302. An example of a method for determining the number of rows and columns of the two-dimensional FEC packet which satisfy a condition of the minimum FEC rate or the maximum FEC rate is described below. Provided that the minimum FEC rate is indicated as "Fmin", the number of rows "X" of the two-dimensional FEC packet (i.e., the number of moving image packets in the row direction) can be obtained according to the following formula.

$$X = 1/F\text{min}$$

Provided that the maximum FEC rate is indicated as "Fmax", the number of columns "Y" of the two-dimensional FEC packet (i.e., the number of moving image packets in the column direction) can be obtained according to the following formula.

$$Y = 1/(F\text{max} - F\text{min})$$

When the minimum FEC rate of Fmin=20% (i.e., 0.2) and the maximum FEC rate of Fmax=50% (i.e., 0.5) are substituted into the above described two formulas, the number of rows of the two-dimensional FEC packets becomes 5 and the number of columns of the two-dimensional FEC packets becomes 3. In the present exemplary embodiment, values after the decimal point of the X and Y are rounded out.

As it is described above, the FEC coding unit 206 of the present exemplary embodiment determines the number of rows and columns of the two-dimensional FEC packet based on the maximum FEC rate and the minimum FEC rate which are determined by the processing unit 204.

In the other words, the FEC coding unit 206 determines the number of moving image packets corresponding to a singular row direction FEC packet (i.e., the number of moving image packets included in a first combination) based on the FEC rate (i.e., rate information) with respect to each of the receiving apparatuses. More specifically, the FEC coding unit 206 determines the number of moving image packets included in the first combination based on the rate information in which the number of error correction packets with respect to the number of moving image packets is relatively small in the FEC rate of the first receiving apparatus and the FEC rate of a second receiving apparatus.

The FEC coding unit 206 determines the number of moving image packets corresponding to a singular column direction FEC packet (i.e., the number of moving image packets included in the second combination) based on the FEC rate (i.e., the rate information) with respect to each of the receiving apparatuses. More specifically, the FEC coding unit 206 determines the number of moving image packets included in the second combination based on the rate information in which the number of error correction packets with respect to the number of moving image packets is relatively large in the FEC rate of the first receiving apparatus and the FEC rate of the second receiving apparatus. An example of the two-dimensional FEC packets which are generated in the manner as described above is illustrated in FIG. 4.

As it is illustrated in FIG. 4, there are 3 FEC packets (i.e., the row direction FEC packets 401 through 403) which are generated by combinations of 15 moving image packets in a horizontal direction. Accordingly, 3/15=20% is obtained. If the FEC packet is transmitted to the client which has the minimum FEC rate, the condition of the minimum FEC rate can be satisfied. Further, since there are 5 moving image packets (i.e., the column direction FEC packets 404 through 408) which are generated by combinations of 15 moving image packets in the vertical direction, 8/15=53% is obtained. Therefore, if all the FEC packets are transmitted to the client which has the maximum FEC rate, the condition of the maximum FEC rate can be satisfied.

In step S303, the FEC coding unit 206 generates the row direction FEC packet and the column direction FEC packet. In other words, the FEC coding unit 206 generates the row direction FEC packet 401 for correcting an error of the moving image packet 409 based on a combination which includes the moving image packet 409 (i.e., the first moving image packet) and the moving image packet 410 which is transmitted following the moving image packet 409 (i.e., the second moving image packet). Further, the FEC coding unit 206 generates the FEC packet 404 for correcting the error of the moving image packet 409 based on a combination which includes the moving image packet 409 and the moving image packet 411 (i.e., a third moving image packet) but which does not include the moving image packet 410.

In step S304, the FEC coding unit 206 determines whether to continue the delivery of the moving image packet. If the FEC coding unit 206 determines to continue the delivery of the moving image packet (YES in step S304), the processing returns to step S301. If the FEC coding unit 206 determines to finish the delivery of the moving image packet (NO in step S304), the processing is ended. When the processing returns to step S301, the FEC coding unit 206 of the present exemplary embodiment determines the FEC generation parameter again every time the generation unit 203 generates the moving image packets which corresponds to 20 GOP. In other words, the determination of the number of rows and columns is repeated while the stream is delivered. Details of the re-determination are described in a second exemplary embodiment of the present invention.

Figure 5:
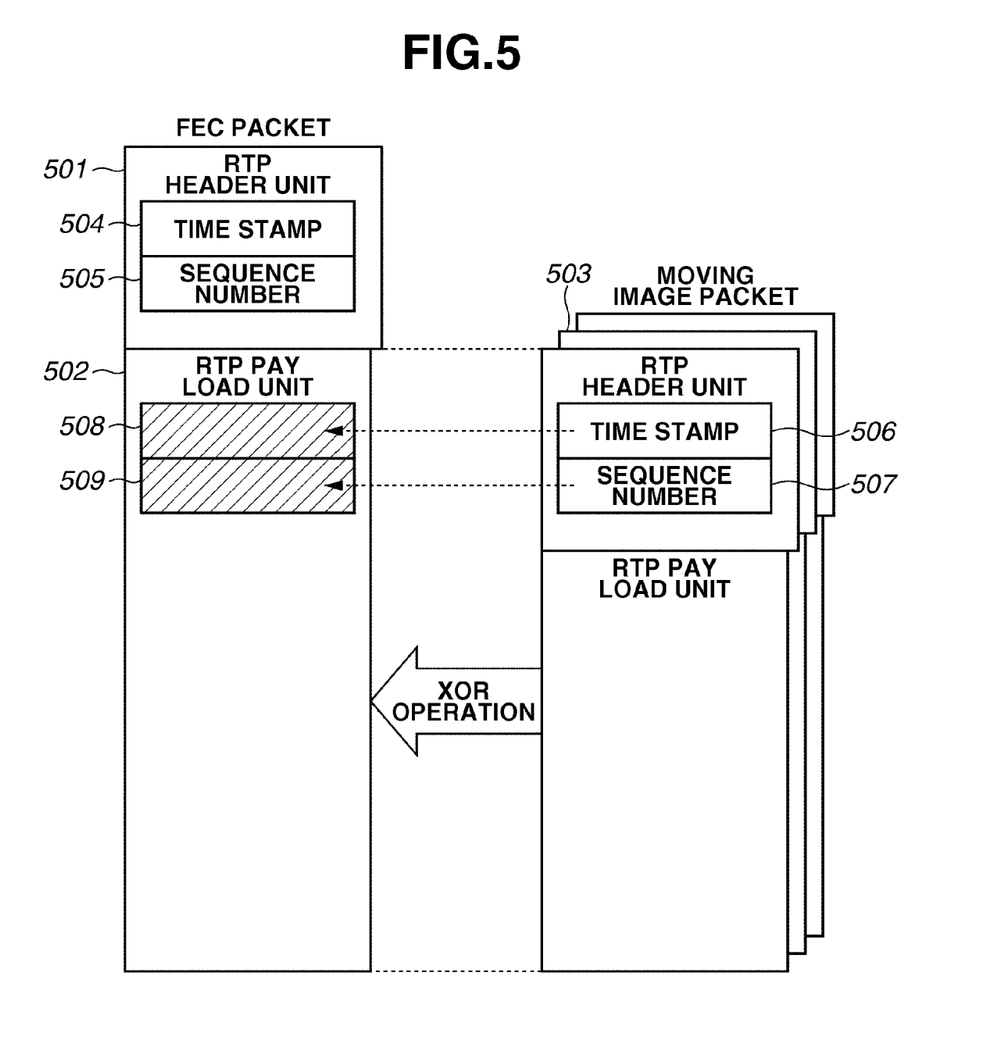
FIG. 5 illustrates data configurations of a moving image packet and an FEC packet.

Processing for changing a portion of data of the FEC packet according to transmission information about each client is described below with reference to FIG. 5. FIG. 5 illustrates a configuration of the FEC packet and the moving image packet. In FIG. 5, a RTP pay load unit 502 of the FEC packet is obtained by executing the XOR operation on more than one moving image packet 503 which corresponds to the FEC packet.

However, in the data within the moving image packet 503, the RTP pay load unit includes the same content for every transmission destination, whereas an RTP header unit includes a time stamp 506 and a sequence number 507 whose contents are different depending on each client of the transmission destination. Therefore, in the data within the RTP pay load unit 502 of the FEC packet, an area 508 corresponding to the time stamp 506 of the moving image packet and an area 509 corresponding to the sequence number 507 are required to be subjected to the XOR operation for each client.

The time stamp and the sequence number requires a small data sizes such as 4 bytes and 2 bytes, respectively, so that, even when the XOR operation is performed for each of the clients, an increase of the load by the processing is smaller than that to generate the FEC packet by individually setting a combination of the moving image packets.

The transmission unit 207 acquires the time stamp and the sequence number of each client from the client transmission information that is stored in the storage unit 208 and performs the XOR operation for every moving image packets to be used in generation of the FEC packet. Then, the transmission unit 207 changes a value of the area 508 and a value of the area 509 respectively corresponding to the time stamp and the sequence number of the RTP pay load unit of the FEC packet which is generated by the FEC coding unit 206 based on a result of the XOR operation obtained in the above method. Further, the transmission unit 207 changes a value of the time stamp 504 and a value of the sequence number 505 of the RTP header unit 501 of the FEC packet to a value according to each client.

Next, processing that the transmission unit 207 selects the FEC packet to be transmitted according to the FEC rate of each client is described below.

Figure 6:
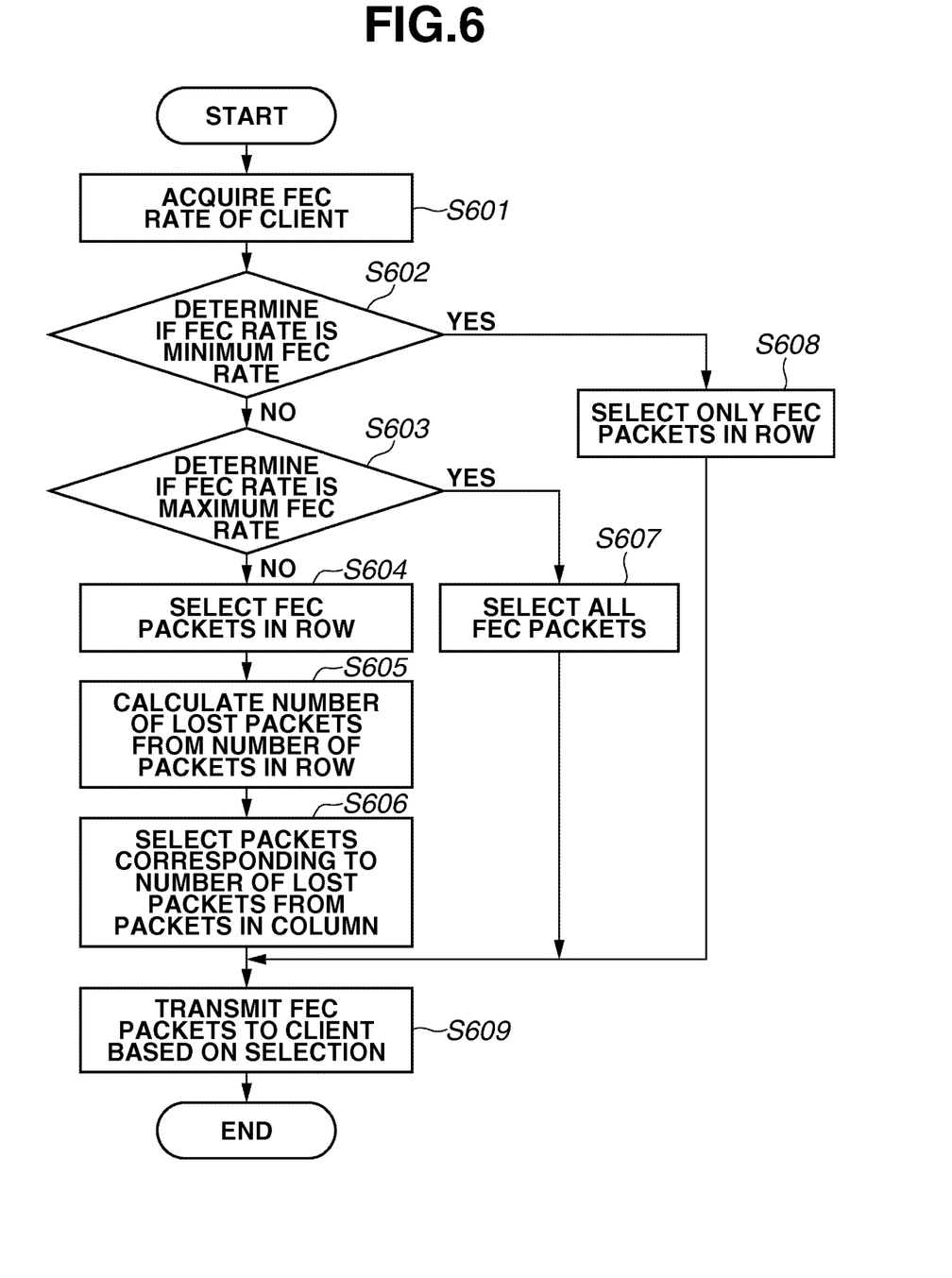
FIG. 6 is a flow chart illustrating processing of selecting an FEC packet to be transmitted by a packet transmission unit.

FIG. 6 is a flow chart illustrating the processing that the transmission unit 207 selects the FEC packet to be transmitted according to the FEC rate of each client. The processing may be executed by a computer (not illustrated) which is connected to the system bus 210 instead of being executed by the transmission unit 207, so that the computer (not illustrated) can transfer the selected packets from the buffer 209 to the transmission unit 207.

In step S601, the transmission unit 207 acquires an FEC rate of an arbitrary client from the storage unit 208. In step S601, it is assumed that the transmission unit 207 acquired the FEC rate from the receiving apparatus 103 (i.e., the first receiving apparatus).

In step S602, the transmission unit 207 determines whether the FEC rate acquired in step S601 is the minimum FEC rate. The transmission unit 207 reads the FEC rates of the other clients which are not read out in step S601 and compares them with the FEC rate acquired in step S601 to determine whether the FEC rate acquired in step S601 is the minimum FEC rate.

In step S602, if the transmission unit 207 determines that the acquired FEC rate is the minimum FEC rate (YES in step S602), the processing proceeds to step S608. Whereas if the transmission unit 207 determines that the acquired FEC rate is not the minimum FEC rate (NO in step S602), the processing proceeds to step S603.

The client 1 with the client number 1 in Table 1 corresponds to the receiving apparatus 103 of FIG. 1. Similarly, the client 2 with the client number 2 of FIG. 1 corresponds to the receiving apparatus 104, and the client 3 with the client number 3 of FIG. 1 corresponds to the receiving apparatus 105. As it is shown in Table 1, since the FEC rate of the client 1 is 20%, the transmission unit 207 determines that the FEC rate of the receiving apparatus 103 is the minimum FEC rate (YES in step S602). Then, the processing proceeds to step S608.

In step S608, the transmission unit 207 selects the FEC packet which is generated from the moving image packets which are sequential in the transmission order as the FEC packet to be transmitted to the client 1 (i.e., the receiving apparatus 103) corresponding to the minimum FEC rate. The FEC packets generated from the moving image packets which are sequential in the transmission order are, for example, the row direction FEC packets 401 through 403 of FIG. 4. In step S608, the transmission unit 207 determines that the column direction FEC packets 404 through 408 which are generated from the moving image packets which are not sequential in the transmission order are not transmitted to the client 1 (i.e., the receiving apparatus 103).

As described above, in the generation pattern by which the FEC packet is generated from the moving image packets which are sequential in the transmission order, the number of moving image packets used in generating one FEC packet (i.e., the number of columns of the two-dimensional FEC packet) is determined based on the minimum FEC rate. When the processing of step S608 is ended, the processing of the flow chart in FIG. 6 is performed on the other clients to whom the moving image packets are delivered.

Now, in a case where FEC packet selection processing of FIG. 6 is performed to the client 2 (i.e., the receiving apparatus 104) is described below.

In step S602, the transmission unit 207 determines that the FEC rate of the client 2 is not the minimum FEC rate (NO in step S602) and thus the processing proceeds to step S603.

In step S603, the transmission unit 207 determines whether the FEC rate of the client 2 that is acquired in step S601 is the maximum FEC rate. If the transmission unit 207 determines that the FEC rate of the client 2 is the maximum FEC rate (YES in step S603), the processing proceeds to step S607. On the other hand, if the transmission unit 207 determines the FEC rate of the client 2 is not the maximum FEC rate (NO in step S603), the processing proceeds to step S604. Since the FEC rate of the client 2 is not the maximum FEC rate, the processing proceeds to step S604.

In step S604, the transmission unit 207 selects all the row direction FEC packets. In the present exemplary embodiment, the row direction FEC packets 401 through 403 are selected. In step S605, the transmission unit 207 calculates a deficient number of FEC packets to the number of FEC packets to be transmitted based on the FEC rate of the client 2 and the number of the row direction FEC packets which are selected in step S604. In the present exemplary embodiment, it is seen that the deficient number of the FEC packets is 2.

Accordingly, in step S606, the transmission unit 207 determines 2 FEC packets among the column direction FEC packets 404 through 408 which are generated by the combination of the moving image packets in the column direction as the FEC packets to be transmitted. When the row direction FEC packets selected in step S604 and the column direction FEC packets selected in step S606 are transmitted to the client 2, the FEC rate of the client 2 is so obtained that $5/15 \approx 33\%$, and the transmission unit 207 can satisfy the condition.

The transmission unit 207 of the present exemplary embodiment determines which FEC packet among the plurality of in the column direction FEC packets 404 through 408 is transmitted based on a display position of the corresponding moving image packets. More specifically, for example, the transmission unit 207 determines the column direction FEC packet to be transmitted so that the column direction FEC packet for correcting an error of the moving image packet, which is displayed at a position nearer to a center of a display screen, is transmitted. With the above described method, the moving image packet displayed nearer to the center of the display screen can be normally reproduced at a possibility higher than the moving image packets displayed at edges of the display screen.

The transmission unit 207 of the present exemplary embodiment determines the column direction FEC packet to be transmitted, for example, such that display positions of the moving image packets the error of which can be corrected with the column direction FEC packet are not adjacent to each other. Accordingly, for example, when the receiving apparatus displays an area of the moving image packets in which the error cannot be corrected by the FEC packet using an error concealing function, an image quality after the error concealment can be improved. The error concealment is a method for displaying an area including an error, for example, by copying data of an area adjacent to the display area of the moving image packets with the error.

Further, for example, the error concealment may be performed such that the column direction FEC packet for correcting the error of the moving image packets, which corresponds to a movable area, may be transmitted. Accordingly, a movable area can avoid occurrence of error in a higher rate than a motionless area within the screen. Examples of a method for detecting the movable area include a method in which a motion vector is referred to and a method in which pixel values of a plurality of frames are compared to each other.

As described above, if the column direction FEC packet corresponding to the moving image packets whose degree of importance is higher is transmitted, the error of the moving image packets which largely affect a reproduced image can be corrected more than the moving image packets which affect less on the reproduced image.

In step S607, the transmission unit 207 further determines to transmit all the FEC packets to the client 3 to which the maximum FEC rate is set. More specifically, in step S603, if the transmission unit 207 determines that the FEC rate set to the client 3 is the maximum FEC rate (YES in step S603), the processing proceeds to step S607. The transmission unit 207 then determines to transmit all of the generated column direction FEC packets and the generated row direction FEC packets to the client 3.

In other words, according to steps S606, S607 and S608 (i.e., determination processing), the transmission unit 207 determines to transmit the moving image packets to all the clients (i.e., the first receiving apparatus 103 and the second receiving apparatuses 104 and 105). Further, the transmission unit 207 determines to transmit all the row direction FEC packets to all the clients.

In steps S606, S607 and S608, the transmission unit 207 determines the transmission destination of a part of the column direction FEC packets (for example, the column direction FEC packets 405 and 407) as follows. More specifically, the transmission unit 207 determines to transmit the column direction FEC packets 405 and 407, not to the receiving apparatus 103 (i.e., the first receiving apparatus), but to the receiving apparatuses 104 and 105 (i.e., the second receiving apparatuses).

The transmission unit 207 further determines to transmit the remaining column direction FEC packets (i.e., the column direction FEC packets 404, 406 and 408) to the receiving apparatus 105.

In step S609 (i.e., the transmission processing), the transmission unit 207 transmits the above determined FEC packets to the clients. More specifically, the transmission unit 207 of the present exemplary embodiment transmits the moving image packets to all the clients.

The transmission unit 207 transmits all the row direction FEC packets to all the clients. The transmission unit 207 further transmits a part of the column direction FEC packets to the receiving apparatuses 104 and 105. Furthermore, the transmission unit 207 transmits the remaining column direction FEC packets to the receiving apparatus 105.

The row direction FEC packet 401 to be transmitted to all the receiving apparatuses is a first error correction packet which is generated based on a first combination including the moving image packet 409 (i.e., a first moving image packet) and a moving image packet 410 (i.e., a second moving image packet). The row direction FEC packet 401 is used, for example, when the receiving apparatus corrects an error of the moving image packet 409.

The column direction FEC packet 404 to be transmitted to the receiving apparatus 105 is a second error correction packet generated based on a second combination which includes the moving image packet 409 and the moving image packet 411 (i.e., a third moving image packet) but does not include the moving image packet 410. The column direction FEC packet 404 is used, for example, when the receiving apparatus corrects the error of the moving image packet 409.

In step S609, the transmission unit 207 transmits the first, the second and the third moving image packets and the first error correction packet to the first and the second receiving apparatuses (i.e., the receiving apparatuses 103 and 105). In step S609, the transmission unit 207 transmits the second error correction packet not to the first receiving apparatus (i.e., the receiving apparatus 103) but to the second receiving apparatus (i.e., the receiving apparatus 105).

As described above, the transmission unit 207 determines the FEC packet to be transmitted based on the FEC rate set to each of the clients. However, as described above, the transmission unit 207 determines the FEC rate according to the received information transmitted from the receiving apparatus. The received information includes, for example, information about an error situation of the moving image packets (i.e., error information).

The transmission unit 207 does not transmit the column direction FEC packet 404 (i.e., the second error correction packet) to the first receiving apparatus (i.e., the receiving apparatus 103) to which the first error information is transmitted. The transmission unit 207 transmits the column direction FEC packet 404 to the second receiving apparatus (i.e., the receiving apparatus 105) to which the second error information indicating that more erroneous moving image packets are included therein than the first error information, is transmitted.

The transmission unit 207 transmits the first, the second and the third moving image packets (i.e., the moving image packets 409, 410 and 411) and the first error correction packet (i.e., the row direction FEC packet 401) to the first receiving apparatus to which the first error information is transmitted and the second receiving apparatus to which the second error information is transmitted.

The FEC rate may be determined based on, for example, the FEC rate that a user of the receiving apparatus directly designates. More specifically, the processing unit 204 can determine the FEC rate of each client based on request information when the processing unit 204 receives the request information about the number of error correction packets with respect to the number of the moving image packets.

In this case, the transmission unit 207 does not transmit the column direction FEC packet 404 (i.e., the second error correction packet) to the first receiving apparatus (i.e., the receiving apparatus 103) to which a first request information is transmitted. The transmission unit 207 transmits the column direction FEC packet 404 to the second receiving apparatus (i.e., the receiving apparatus 105) to which a second request information indicating that the number of error correction packets with respect to the moving image packets is larger than that in the first request information is transmitted.

The transmission unit 207 further transmits the first, the second and the third moving image packets (i.e., the moving image packets 409, 410 and 411) and the first error correction packet (i.e., the row direction FEC packet 401) to the first receiving apparatus to which the first request information is transmitted and the second receiving apparatus to which the second request information is transmitted.

The row direction FEC packet 402 which is transmitted to all the receiving apparatuses is a third error correction packet which is generated based on a combination including the moving image packet 411 (i.e., the third moving image packet) and the moving image packet 412 (i.e., a fourth moving image packet) which is transmitted following the moving image packet 411. The error correction packet 402 is, for example, used by the receiving apparatus to correct an error of the moving image packet 411.

The FEC coding unit 206 generates the row direction FEC packet 402 as well as generates the column direction FEC packet 405 (i.e., a fourth error correction packet). The column direction FEC packet 405 is an error correction packet by which the receiving apparatus corrects an error of the moving image packet 410 based on a combination including the second moving image packet 410 and the fourth moving image packet 412 which are not sequential in the transmission order.

The transmission unit 207 transmits the moving image packets and the row direction FEC packets to all the clients (i.e., the receiving apparatuses 103 through 105). The transmission unit 207 further transmits all the column direction FEC packets to the client corresponding to the maximum FEC rate (i.e., the receiving apparatus 105). The transmission unit 207 further transmits the column direction FEC packet 405, which has higher importance, among the column direction FEC packets to the client (i.e., receiving apparatus 104) which does not correspond to either of the maximum FEC rate or the minimum FEC rate, according to the FEC rate.

In other words, the transmission unit 207 transmits the first, the second, the third and the fourth moving image packets (i.e., the moving image packets 409 through 412) and the first and the third error correction packets (the column direction FEC packets 401 and 402) to the first, the second, and the third receiving apparatuses. Furthermore, the transmission unit 207 transmits the second error correction packet (i.e., the column direction FEC packet 404) not to the first and the third receiving apparatuses, but to the second receiving apparatus (i.e., the client 3). Then, the transmission unit 207 transmits the fourth error correction packet (i.e., the column direction FEC packet 405), whose importance is higher than the second error correction packet, not to the first receiving apparatus (i.e., the client 1), but to the second and the third receiving apparatuses (i.e., the clients 3 and 2)

In the present exemplary embodiment, a case where the column direction FEC packet 405 has higher importance than the column direction FEC packet 404 is described. However, there may be a case where the column direction FEC packet 404 has higher importance depending on a method for determining the importance. In this case, the transmission unit 207 does not transmit the column direction FEC packet 404 which has higher importance to the first receiving apparatus but transmits the FEC packet 404 to the second and the third receiving apparatuses. Further, the transmission unit 207 does not transmit the column direction FEC packet 405 to the first and the second receiving apparatuses but transmit the FEC packet 405 to the third receiving apparatus.

As it is described above, the transmission apparatus 101 of the present exemplary embodiment determines the number of moving image packets (i.e., the FEC generation parameter) for generating the row direction FEC packet and the column direction FEC packet based on the FEC rate determined between each of the clients and the transmission apparatus 101. Then, the transmission apparatus 101 determines the FEC packet to be transmitted according to the FEC rate of each client. Accordingly, a load generated when the FEC packet corresponding to the FEC rate of each client is transmitted can be reduced than a load in a case where the FEC packet is generated for each client.

In the present exemplary embodiment, the row direction FEC packet is transmitted to all the clients. Accordingly, at least one FEC packet corresponding to all the moving image packets can be transmitted to all the clients.

Now, a second exemplary embodiment of the present invention is described below. In the below description, difference from the first exemplary embodiment is mainly described. In the present exemplary embodiment, an example of a case where the FEC rate fluctuates according to fluctuation of the error rate in the communication route from the transmission apparatus 101 to each of the clients is described.

As described above, the available network band and the packet loss rate may hourly fluctuate in the Internet connection, and the packet loss rate may largely fluctuate in a segment of the wireless communication. Therefore, the packet loss rate on the route to each client also hourly fluctuates. In the present exemplary embodiment, a case where the moving image packet and the FEC packet are transmitted with the more appropriate FEC rate by dynamically changing the FEC rate according to the hourly fluctuated packet loss rate is described below.

Table 2 shows that a necessary FEC rate decreases from 20% to 15% as a result of decrease of the packet loss rate in the route to the client 1 from the condition in Table 1. Table 2 shows that a necessary FEC rate increases from 50% to 60% as a result that the packet loss rate increased in the route to the client 3. An example of changing the number of moving image packets for generating the FEC packet according to the above described change in the packet loss rate and the FEC rate is described by using the flow chart of FIG. 3.

TABLE 2

| Client Number | IP address | Sequence Number | Time Stamp | FEC rate |
|---|---|---|---|---|
| 1 | 192.168.1.1 | 2543 | 659321 | 15% |
| 2 | 192.254.3.1 | 1641 | 576890 | 30% |
| 3 | 172.100.9.1 | 8348 | 354678 | 60% |

Processing illustrated in the flow chart in FIG. 3 is started, for example, in response to reception, by the FEC coding unit 206, of a generation notification of the moving image packets from the generation unit 203.

In step S301, the FEC coding unit 206 acquires the client transmission information from the storage unit 208. In the present exemplary embodiment, the client transmission information as shown in Table 2 is acquired.

In step S302, the FEC coding unit 206 extracts the FEC rate from the acquired client transmission information and specifies the minimum FEC rate and the maximum FEC rate. In this example, the minimum FEC rate and the maximum FEC rate are specified as 15% and 60%, respectively. The FEC rate is determined by the determination unit 205 based on the received information from each client.

In step S303, the FEC coding unit 206 determines the number of rows and columns of the two-dimensional FEC packet (i.e., the FEC generation parameter) based on the minimum FEC rate and the maximum FEC rate specified in step S302. The same method as that of the first exemplary embodiment is employed in determining the number of rows and columns. In the example of Table 2, the number of moving image packets for generating the row direction FEC packet is 6. Also, the number of moving image packets for generating the column direction FEC packet is 2.

More specifically, the FEC coding unit 206 determines the number of moving image packets corresponding to a singular row direction FEC packet (i.e., the number of moving image packets included in the first combination) is 5 when the FEC rate of the client 1 which has the minimum FEC rate is 20% as it is shown in Table 1. The FEC coding unit 206 changes the number of moving image packets corresponding to the singular row direction FEC packet to 6 in response to that the FEC rate of the client 1 which has the minimum FEC rate decreases to 15% as it is shown in Table 2.

The FEC coding unit 206 increases the number of moving image packets included in the first combination when the first rate information (i.e., the FEC rate) is changed such that the number of the error correction packets with respect to the moving image packets to be transmitted to the first receiving apparatus (i.e., the client 1) decreases.

Figure 7:
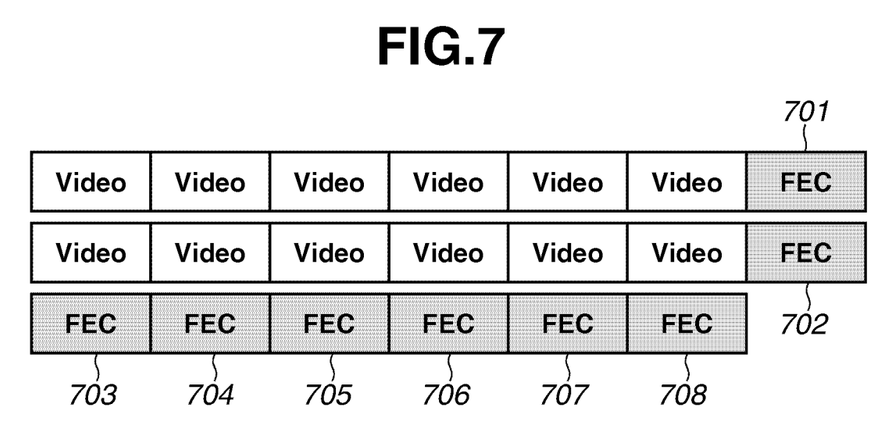
FIG. 7 illustrates two-dimensional FEC packets generated according to a second exemplary embodiment.

An example of the two-dimensional FEC packets to be generated according to the above method is illustrated in FIG. 7. As it is illustrated in FIG. 7, since there are 2 row direction FEC packets (i.e., packets 701 and 702) with respect to 12 moving image packets, the FEC rate can be obtained by $2/12=16\%$. Consequently, if the transmission unit 207 transmits the row direction FEC packet to the client with the minimum FEC rate, the condition of the minimum FEC rate can be satisfied. On the other hand, since there are 6 column direction FEC packets (i.e., packets 703 through 708) with respect to 12 moving image packets, the FEC rate can be obtained by $8/12=66\%$. Consequently, if the transmission unit 207 transmits the row direction FEC packet and the column direction FEC packet to the client with the maximum FEC rate, the condition of the maximum FEC rate can be satisfied.

With respect to the client 2 (i.e., the receiving apparatus 104) whose FEC rate is 30%, if 4 FEC packets with respect to 12 moving image packets are transmitted to the client 2, the FEC rate can be obtained by $4/12=33\%$, and thus the condition of the determined FEC rate can be satisfied. Therefore, the transmission unit 207 transmits 2 packets from 6 column direction FEC packets and 2 row direction FEC packets in to the client 2.

In step S304, the FEC coding unit 206 determines whether to continue the delivery of the moving image packet. If the FEC coding unit 206 determines to continue the delivery of the moving image packet (YES in step S304), the processing returns to step S301. If the FEC coding unit 206 determines to finish the delivery of the moving image packet (NO in step S304), the processing is ended. As it is described in the first exemplary embodiment, the FEC coding unit 206 may perform reading of the FEC rate and determination of the FEC generation parameter in response to each reception of the generation notification of the moving image packets. Further, the FEC coding unit 206 may perform reading of the FEC rate and determination of the FEC generation parameter at constant intervals or every time the FEC coding unit 206 receives the received information from the receiving apparatus.

As described above, the transmission apparatus 101 of the present exemplary embodiment changes the FEC generation parameter according to the change of the FEC rate. Accordingly, the load occurred in generation of the error correction data based on the data amount of the error correction data set for each transmission destination can be reduced, and the FEC packets which is more appropriate to the changed communication situation can be generated.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium). In such a case, the system or apparatus, and the recording medium where the program is stored, are included as being within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-094101 filed Apr. 8, 2009, which is hereby incorporated by reference herein in its entirety.

What is claimed is:

1. An apparatus comprising:
  a generation unit configured to generate a first error correction packet to correct an error in a first moving image packet using a first combination of moving image packets including the first moving image packet and a second moving image packet, and to generate a second error correction packet to correct the error in the first moving image packet using a second combination of moving image packets including the first moving image packet and a third moving image packet;
  a first determination unit configured to determine to transmit the first, the second, and the third moving image packets to a first and a second receiving apparatuses, to transmit the first error correction packet to the first and the second receiving apparatuses, to transmit the second error correction packet to the second receiving apparatus, and not to transmit the second error correction packet to the first receiving apparatus; and
  a second determination unit configured to determine, based on a number of error correction packets to be transmitted to the first receiving apparatus when a predetermined number of moving image packets are transmitted to the first receiving apparatus, a number of the moving image packets included in the first combination and used for generating the first error correction packet.

2. The apparatus according to claim 1,
wherein the first error correction packet is generated based on the first combination which is sequentially transmitted after the first moving image packet.

3. The apparatus according to claim 1, further comprising:
  a receiving unit configured to receive error information of the moving image packet; and
  a third determination unit configured to determine, based on the error information, a number of error correction packets to be transmitted to a receiving apparatus when the predetermined number of the moving image packets are transmitted to the receiving apparatus;
  wherein when the predetermined number of the moving image packets are transmitted to the first and second receiving apparatuses, the first receiving apparatus receives less erroneous moving image packets than the second receiving apparatus, and
  wherein the second determination unit determines, based on the number of erroneous moving image packets among the moving image packets received by the first receiving apparatus, a number of the moving image packets included in the first combination and used for generating the first error correction packet.

4. The apparatus according to claim 1,
wherein the second error correction packet is generated based on the second combination, a third error correction packet is generated to correct an error in the third moving image packet based on a combination of moving image packets including the third moving image packet and a fourth moving image packet to be transmitted next to the third moving image packet, and a fourth error correction packet is generated to correct an error in the second moving image packet based on a combination of moving image packets including the second moving image packet and the fourth moving image packet, and
wherein the first, the second, the third, and the fourth moving image packets and the first and the third error correction packets are transmitted to the first receiving apparatus, the second receiving apparatus and a third receiving apparatus, respectively, the second error correction packet is transmitted to the second receiving apparatus, and the fourth error correction packet is transmitted to the second and the third receiving apparatuses.

5. The apparatus according to claim 4,
wherein the generation unit generates the second and the fourth error correction packets based on a combination of the moving image packets which are not sequential in the transmission order, and
wherein when a degree of importance of the second moving image packet is higher than that of the first moving image packet, the fourth error correction packet is transmitted, to correct the error in the second moving image packet, to the second receiving apparatus and the third receiving apparatus, respectively, and the second error correction packet is transmitted, to the second receiving apparatus, to correct the error in the first moving image packet.

6. A method comprising:
generating a first error correction packet to correct an error in a first moving image packet using a first combination of moving image packets including a first moving image packet and a second moving image packet;
generating a second error correction packet to correct the error in the first moving image packet using a second combination of moving image packets including the first moving image packet and a third moving image packet;
determining to transmit the first, the second and the third moving image packets to a first and a second receiving apparatuses;
determining to transmit the first error correction packet to the first and the second receiving apparatuses;
determining to transmit the second error correction packet to the second receiving apparatus and not to transmit the second error correction packet to the first receiving apparatus; and determining, based on a number of error correction packets to be transmitted to the first receiving apparatus when a predetermined number of moving image packets are transmitted to the first receiving apparatus, a number of the moving image packets included in the first combination and used for generating the first error correction packet.

7. The method according to claim 6, further comprising:

receiving error information of the moving image packet; and determining, based on the error information, a number of error correction packets to be transmitted to a receiving apparatus when the predetermined number of the moving image packets are transmitted to the receiving apparatus;

wherein, when the predetermined number of the moving image packets are transmitted to the first and the second receiving apparatuses, the first receiving apparatus receives less erroneous moving image packets than the second receiving apparatus, and determining, based on the number of erroneous moving image packets among the moving image packets received by the first receiving apparatus, a number of the moving image packets included in the first combination and used for generating the first error correction packet.

8. A computer readable storage medium storing a program executable of instructions for causing a computer to perform a method comprising:

generating a first error correction packet to correct an error in a first moving image packet using a first combination of moving image packets including the first moving image packet and a second moving image packet;

generating a second error correction packet to correct the error in the first moving image packet using on a second combination of moving image packets including the first moving image packet and a third moving image packet;

determining to transmit the first, the second and the third moving image packets to a first and a second receiving apparatuses;

determining to transmit the first error correction packet to the first and the second receiving apparatuses determining to transmit the second error correction packet to the second receiving apparatus and not to transmit the second error correction packet to the first receiving apparatus; and determining, based on a number of error correction packets to be transmitted to the first receiving apparatus when a predetermined number of moving image packets are transmitted to the first receiving apparatus, a number of the moving image packets included in the first combination and used for generating the first error correction packet.

9. The computer readable storage medium according to claim 8, further comprising:

receiving error information about an error situation of the moving image packet; and determining, based on the error information, a number of error correction packets to be transmitted to a receiving apparatus when the predetermined number of the moving image packets are transmitted to the receiving apparatus;

wherein, when the predetermined number of the moving image packets are transmitted to the first and the second receiving apparatuses, the first receiving apparatus receives less erroneous moving image packets than the second receiving apparatus, and determining, based on the number of erroneous moving image packets among the moving image packets received by the first receiving apparatus, a number of the moving image packets included in the first combination and used for generating the first error correction packet.

10. The apparatus according to claim 1, wherein the second determination unit determines, based on a number of error correction packets to be transmitted to the first receiving apparatus when a predetermined number of moving image packets are transmitted to the first receiving apparatus and a number of error correction packets to be transmitted to the second receiving apparatus when a predetermined number of moving image packets are transmitted to the second receiving apparatus, a number of the moving image packet included in the second combination and used for generating the second error correction packet.

11. The apparatus according to claim 1, further comprising:

a storage unit configured to store information about a number of error correction packets to be transmitted when the predetermined number of the moving image packets are transmitted to the receiving apparatus, wherein the stored number of error correction packets to be transmitted to the second receiving apparatus is more than the number of error correction packets to be transmitted to the first receiving apparatus.

12. The apparatus according to claim 1, wherein, if a number of error correction packets to be transmitted to the first receiving apparatus when a predetermined number of moving image packets are transmitted to the first receiving apparatus is reduced, a number of moving image packets included in the first combination and used for generating the first error correction packet is increased.

13. The method according to claim 6, further comprising:

determining, based on a number of error correction packets to be transmitted to the first receiving apparatus when a predetermined number of moving image packets are transmitted to the first receiving apparatus and a number of error correction packets to be transmitted to the second receiving apparatus when a predetermined number of moving image packets are transmitted to the second receiving apparatus, a number of moving image packets included in the second combination and used for generating the second error correction packet.

14. The method according to claim 6, further comprising:

storing information about a number of error correction packets to be transmitted when the predetermined number of the moving image packets are transmitted to the receiving apparatus, wherein the stored number of error correction packets to be transmitted to the second receiving apparatus is more than the number of error correction packets to be transmitted to the first receiving apparatus.

15. The method according to claim 6, further comprising:

if a number of error correction packets to be transmitted to the first receiving apparatus when a predetermined number of moving image packets are transmitted to the first receiving apparatus is reduced, a number of moving image packets included in the first combination and used for generating the first error correction packet is increased.

16. The computer readable storage medium according to claim 8, further comprising:

determining, based on a number of error correction packets to be transmitted to the first receiving apparatus when a predetermined number of moving image packets are transmitted to the first receiving apparatus and a number of error correction packets to be transmitted to the second receiving apparatus when a predetermined number of moving image packets are transmitted to the second receiving apparatus, a number of moving image packets included in the second combination and used for generating the second error correction packet.

17. The computer readable storage medium according to claim 8, further comprising:
storing information about a number of error correction packets to be transmitted when the predetermined number of the moving image packets are transmitted to the receiving apparatus,
wherein the stored number of error correction packets to be transmitted to the second receiving apparatus is more than the number of error correction packets to be transmitted to the first receiving apparatus.

18. The computer readable storage medium according to claim 8, further comprising:
if a number of error correction packets to be transmitted to the first receiving apparatus when a predetermined number of moving image packets are transmitted to the first receiving apparatus is reduced, a number of moving image packets included in the first combination and used for generating the first error correction packet is increased.

* * * * *